(12) United States Patent
Chen et al.

(10) Patent No.: US 11,631,640 B2
(45) Date of Patent: Apr. 18, 2023

(54) METAL LOSS PREVENTION IN CONDUCTIVE STRUCTURES

(71) Applicant: Taiwan Semiconductor Manufacturing Co., Ltd., Hsinchu (TW)

(72) Inventors: Yen-Yu Chen, Taichung (TW); Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/675,302

(22) Filed: Feb. 18, 2022

(65) Prior Publication Data

US 2022/0173036 A1    Jun. 2, 2022

Related U.S. Application Data

(62) Division of application No. 16/901,688, filed on Jun. 15, 2020, now Pat. No. 11,257,755.

(51) Int. Cl.
*H01L 23/522* (2006.01)
*H01L 21/768* (2006.01)
(Continued)

(52) U.S. Cl.
CPC .... *H01L 23/5228* (2013.01); *H01L 21/02592* (2013.01); *H01L 21/76802* (2013.01);
(Continued)

(58) Field of Classification Search
CPC ......... H01L 21/76877; H01L 21/76802; H01L 21/76888; H01L 29/665; H01L 29/4966–4975; H01L 29/41725–41791
See application file for complete search history.

(56) References Cited

U.S. PATENT DOCUMENTS 6,962,873 B1    11/2005    Park
7,294,544 B1    11/2007    Ho et al.
(Continued)

FOREIGN PATENT DOCUMENTS

KR    20170090348 A    8/2017
KR    20200033738 A    3/2020

OTHER PUBLICATIONS

Notice of Allowance directed to related Korean Patent Application No. 10-2020-0161824, dated Feb. 23, 2023; 8 pages.

*Primary Examiner* — Bac H Au
(74) *Attorney, Agent, or Firm* — Sterne, Kessler, Goldstein & Fox P.L.L.C.

(57) ABSTRACT

The present disclosure describes a method for forming a barrier structure between liner-free conductive structures and underlying conductive structures. The method includes forming openings in a dielectric layer disposed on a contact layer, where the openings expose conductive structures in the contact layer. A first metal layer is deposited in the openings and is grown thicker on top surfaces of the conductive structures and thinner on sidewall surfaces of the openings. The method further includes exposing the first metal layer to ammonia to form a bilayer with the first metal layer and a nitride of the first metal layer, and subsequently exposing the nitride to an oxygen plasma to convert a portion of the nitride of the first metal layer to an oxide layer. The method also includes removing the oxide layer and forming a semiconductor-containing layer on the nitride of the first metal layer.

20 Claims, 10 Drawing Sheets

(51) Int. Cl.
*H01L 23/535* (2006.01)
*H01L 21/02* (2006.01)
*H01L 23/532* (2006.01)

(52) U.S. Cl.
CPC .. *H01L 21/76877* (2013.01); *H01L 21/76888* (2013.01); *H01L 23/535* (2013.01); *H01L 23/53266* (2013.01)

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,529,663 B1 | 1/2020 | Nogami et al. |
| 10,847,417 B1 | 11/2020 | Yao et al. |
| 10,964,792 B1 | 3/2021 | Cheng et al. |
| 10,985,061 B2 | 4/2021 | Wang et al. |
| 10,998,228 B2 | 5/2021 | Yen et al. |
| 2007/0020829 A1 | 1/2007 | Hotta et al. |
| 2008/0265417 A1 | 10/2008 | Kawamura et al. |
| 2013/0264620 A1 | 10/2013 | Yu et al. |
| 2015/0235922 A1 | 8/2015 | Chen et al. |
| 2017/0098606 A1 | 4/2017 | Lu et al. |
| 2017/0221821 A1 | 8/2017 | Hu et al. |
| 2019/0157405 A1 | 5/2019 | Huang et al. |
| 2020/0006230 A1 | 1/2020 | Tsai et al. |
| 2020/0091011 A1 | 3/2020 | Khaderbad et al. |
| 2020/0105605 A1 | 4/2020 | Teng et al. |
| 2020/0127089 A1 | 4/2020 | Hsu et al. |
| 2021/0202310 A1 | 7/2021 | Hsieh et al. |
| 2021/0391255 A1 | 12/2021 | Chen et al. |

METAL LOSS PREVENTION IN CONDUCTIVE STRUCTURES

CROSS-REFERENCE TO RELATED APPLICATIONS

This application is a divisional of U.S. patent application Ser. No. 16/901,688, titled "Metal Loss Prevention in Conductive Structures," filed Jun. 15, 2020, the disclosure of which is incorporated by reference herein in its entirety.

BACKGROUND

In an integrated circuit, conductive structures (e.g., metal contacts) are electrically coupled to transistor regions, such as the gate electrode and the source/drain regions, and are configured to propagate electrical signals from and to the transistors. The conductive structures, depending on the complexity of the integrated circuit, may form one or more layers of metal wiring.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
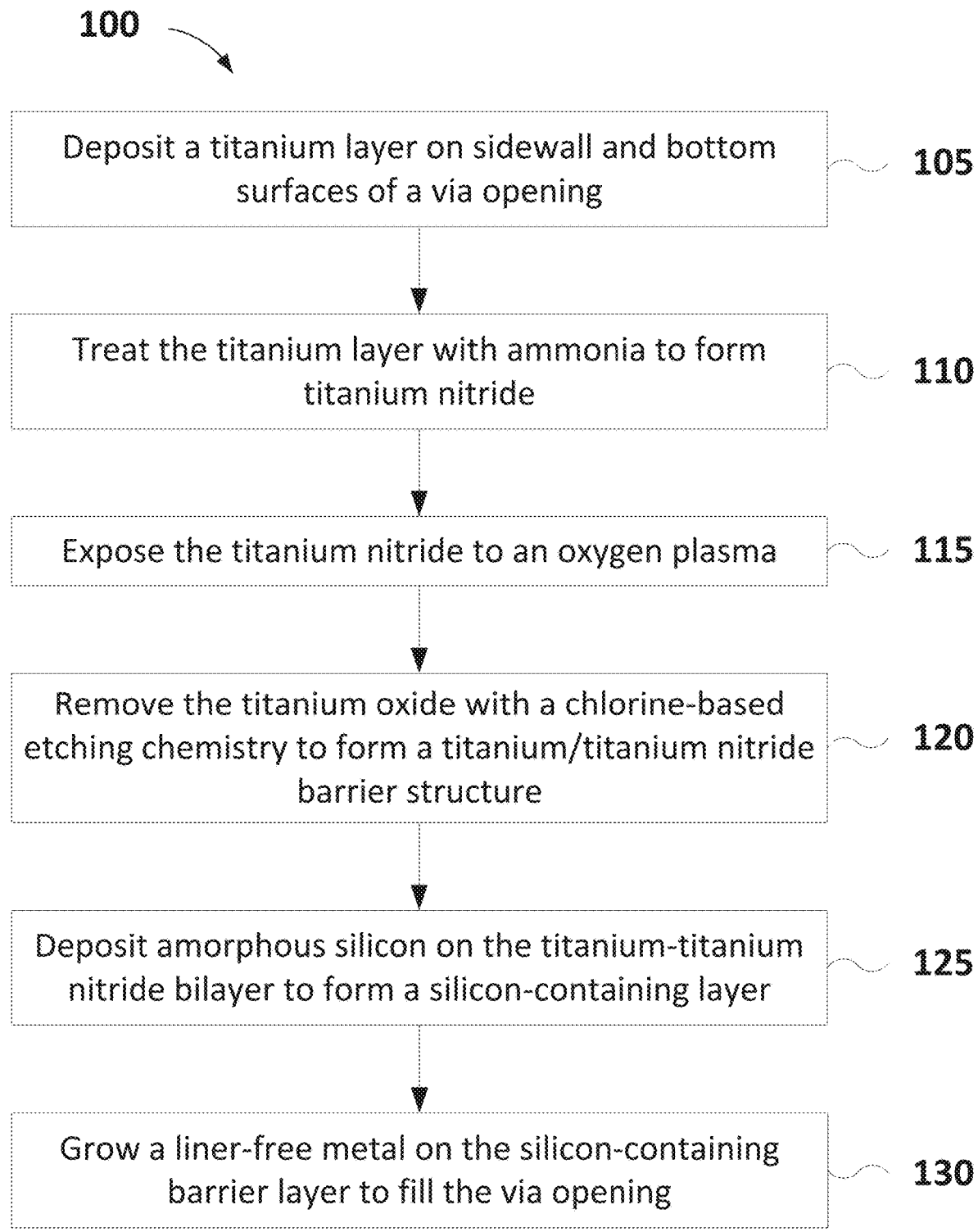
FIG. 1 is a method for the formation of a barrier structure between liner-free vias and a contact layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in an integrated circuit (IC) are interconnected locally and globally with conductive structures, such as metal contacts, metal vias and metal lines. These conductive structures are formed in metallization layers stacked on top of each other. The fabrication of each metallization layer requires several operations including, but not limited to, deposition of dielectric and conductive materials, photolithography and etching (e.g., patterning), removal of contaminants (e.g., wet cleaning), polishing and planarization, etc. These fabrication operations need to be compatible with the materials used in the underlying metallization layers to avoid defects and other integration issues.

Conductive structures that feature no barrier or liner layers between a metal fill and surrounding materials (also referred to herein as "liner-free conductive structures") have become attractive because they have lower electric resistance characteristics compared to conductive structures with barrier or liner layers. Challenges arise in the fabrication processing of liner-free conductive structures because such structures require fill metals that can be grown with a bottom-up approach. In the bottom-up approach, metal growth starts from nucleation sites at the bottom of the conductive structure. By way of example and not limitation, metals that can be grown with a bottom-up process include molybdenum (Mo), tungsten (W), ruthenium (Ru), iridium (Ir), cobalt (Co), etc. However, as the metal grows from bottom and fills contact or via openings, gaps can be formed between sidewall surfaces of the contact or via openings and the metal. These gaps can be formed, for example, because the grains of the metal do not align with the sidewall surfaces of the contact or via opening. These gaps can extend vertically along the sidewall surfaces of the conductive structure and provide a path for chemicals used in subsequent processes to reach and erode underlying conductive structures. Such chemicals can include, but are not limited to, wet etching chemicals, wet clean solutions, slurry from chemical mechanical planarization (CMP) processes, etc.

To address the aforementioned shortcomings, this disclosure is directed to a method for forming a barrier structure between liner-free conductive structures (e.g., liner-free metal vias) and underlying conductive structures (e.g., metal contacts) to prevent slurry or other chemicals from processes used in the liner-free conductive structures to reach and erode the metal fill of underlying conductive structures. In some embodiments, the barrier structure includes a titanium/titanium nitride (Ti/TiN) bilayer with a silicide or germanide layer thereon. In some embodiments, the silicon (Si) or germanium (Ge) incorporated in the barrier structure functions as a seed for the subsequent bottom-up growth of the metal fill in the liner-free conductive structures. In some embodiments, the formation of the barrier structure includes, but is not limited to, the deposition, nitridation, and oxidation of a titanium (Ti) layer on the sidewall and bottom surfaces of via or contact openings, and the subsequent deposition of an amorphous Si or Ge layer. In some embodiments, the method is not limited to Ti layers. For example, other metals can be used, such as tantalum (Ta) or nickel (Ni).

FIG. 1 is a flow chart of a fabrication method 100 describing the formation process of a barrier structure between a liner-free conductive structure and an underlying conductive structure. In some embodiments, fabrication method 100 forms the aforementioned barrier structure in a bottom surface of a via or contact opening subsequently filled with a liner-free conductive material. Other fabrication operations may be performed between the various operations of method 100 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIG. 1. In some embodiments, one or more other operations may be performed in addition to or in place of the presently described operations. Method 100 will be described in reference to FIGS. 2-9, which are for illustrative purposes only and not to scale. Some structures, films, or geometries may have been deliberately augmented or omitted for illustrative purposes.

Figure 2:
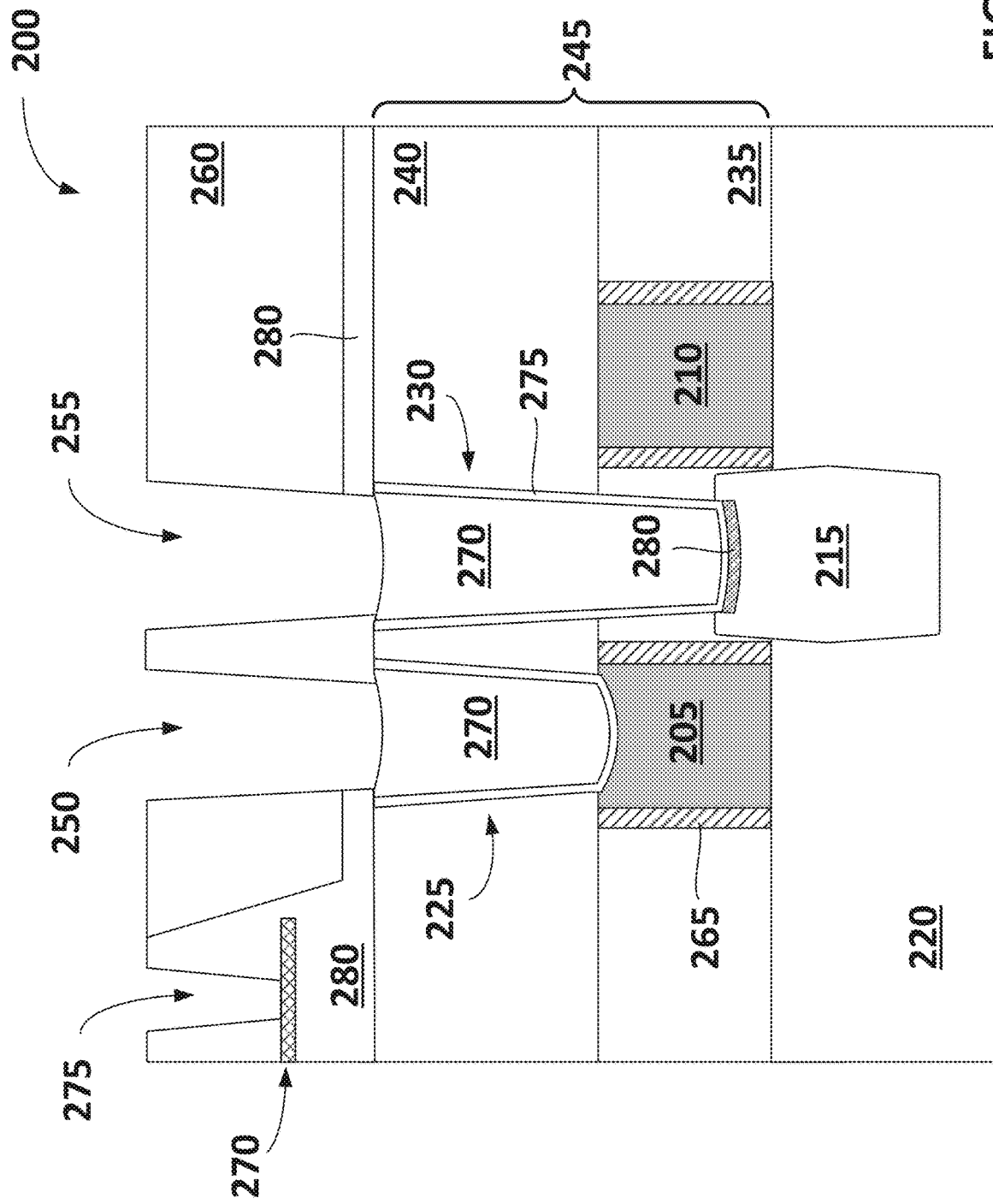
FIGS. 2-8 are cross-sectional views of intermediate structures during the fabrication of a barrier structure formed between liner-free vias and a contact layer, in accordance with some embodiments.

By way of example and not limitation, FIG. 2 is a cross-sectional view of a precursor structure 200 used as a starting point for method 100. In some embodiments, precursor structure 200 includes gate structures 205/210 and source/drain (S/D) epitaxial stack 215 formed on a semiconductor substrate 220. In the example of precursor structure 200, gate contact 225 and S/D contact 230 are disposed, respectively, on gate structure 205 and S/D epitaxial stack 215 as shown in FIG. 2. In some embodiments, another gate contact (not shown) can be formed on gate structure 210. The gate structures (e.g., gate structure 205 and 210) and the contacts (e.g., gate contact 225 and S/D contact 230) are electrically isolated by dielectric layers 235 and 240. In some embodiments, gate contact 225 and S/D contact 230, along with dielectric layers 235 and 240, form a contact layer 245—e.g., a first metallization layer. In FIG. 2, the contacts (e.g., gate contact 225 and S/D contact 230) are shown with a "curved" bottom surface as opposed to a flat bottom surface. In some embodiments, this can be attributed to the etching process used in the contact opening formation process which recesses (e.g., over-etches) the underlying structure to increase the surface area between the contact and the underlying structure.

As shown in FIG. 2, via openings 250 and 255 are formed in a dielectric layer 260, which is disposed on dielectric layer 240 of contact layer 245. Via openings 250 and 255, which can be formed with photolithography and etching operations and have an aspect ratio between about 5:1 and about 8:1, expose top surfaces of gate contact 225 and S/D contact 230. In some embodiments, via openings 250 and 255 will be filled with a metal (e.g., Mo, Ru, or W) to form liner-free vias that connect to respective contacts of the underlying contact layer 245. As shown in FIG. 2, via openings 250 and 255 can have a "curved" bottom surface with gate contact 225 and S/D contact 230, as discussed above.

FIG. 2 further includes a resistor structure 270. Resistor structures (e.g., like resistor structure 270) are passive elements used, for example, to reduce current flow, adjust signal levels, divide voltages, etc. In some embodiments, resistor structure 270 includes TiN or another resistive material such as tungsten nitride (WN). A via opening 275, like via openings 250 and 255, is formed in dielectric layer 260 to expose a portion of resistor structure 270. In some embodiments, resistor structure 270 is embedded in an etch stop layer 280, which facilitates the formation of via openings 250, 255, and 275. Similarly to via openings 250 and 255, opening 275 will be filled with a metal (e.g., Mo, Ru, or W) to form a liner-free via to connect resistor structure 270 to upper metallization layers.

In some embodiments, semiconductor substrate 220 is a bulk semiconductor wafer (e.g., a silicon bulk wafer), a top semiconductor layer of a semiconductor-on-insulator (SOI) wafer, or a semiconductor fin structure formed on a bulk wafer or an SOI wafer. By way of example and not limitation, S/D epitaxial stack 215 forms a S/D region for gate structures 205 and 210, and includes one or more epitaxially grown layers—such as boron doped silicon germanium (B:SiGe) or phosphorous doped silicon carbon (P:SiC). In some embodiments, gate structures 205 and 210 include multiple layers not shown in FIG. 2 for simplicity. By way of example and not limitation, these layers can include a gate dielectric stack, one or more work function layers, and a metal fill. Gate structures 205 and 210 are isolated from epitaxial stack 215 by spacer structures 265, which can include one or more dielectric layers, such as silicon nitride ($Si_3N_4$). In some embodiments, dielectric layers 235, 240, and 260 are silicon oxide-based interlayer dielectric layers (ILD layers) that can include carbon, hydrogen, and nitrogen. Dielectric layers 235, 240, and 260 can be deposited with a chemical vapor deposition (CVD) process, a plasma-assisted CVD (PECVD) process, or any other suitable deposition process.

According to some embodiments, gate contact 225 and S/D contact 230 are filled with a metal 270 surrounded by liner layer 275. By way of example and not limitation, metal 270 includes Co and liner layer 275 includes a Ti/TiN stack. Referring to S/D contact 230, the Ti layer from liner layer 275 reacts with the silicon atoms in S/D epitaxial stack 215 to form a silicide layer 280 (e.g., a titanium silicide ($TiSi_x$) layer), which reduces the contact resistance between S/D contact 230 and S/D epitaxial stack 215. In some embodiments, silicide layer 280 is not limited to $TiSi_x$. For example, silicide layer 280 can be nickel silicide (NiSi) or cobalt silicide (CoSi).

Figure 3:
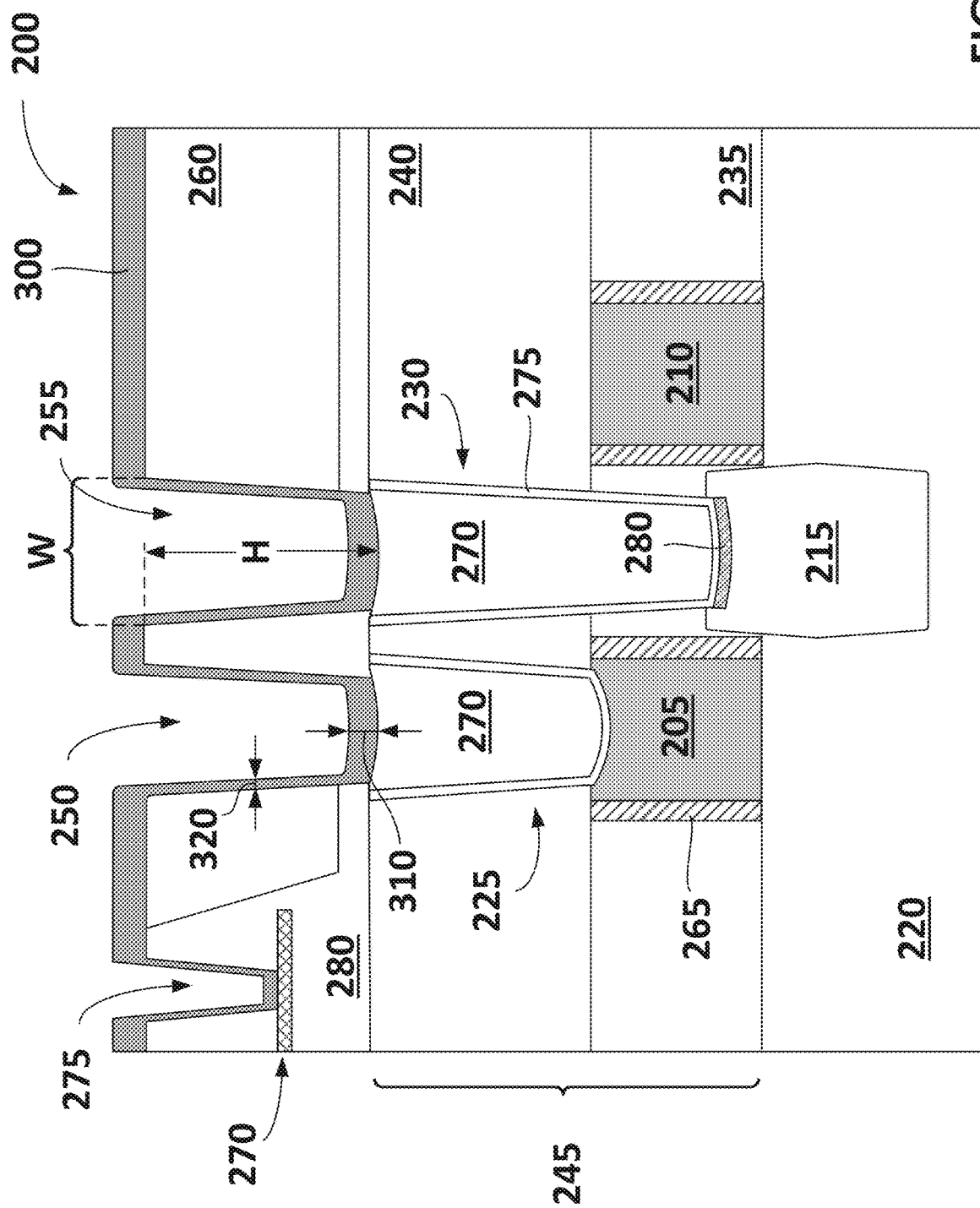

In referring to FIG. 1, method 100 begins with operation 105 and the process of depositing a Ti layer on sidewall and bottom surfaces of a via opening, such as via openings 250, 255, and 275 of precursor structure 200 shown in FIG. 2. By way of example and not limitation, FIG. 3 shows precursor structure 200 after the formation of a Ti layer 300 according to operation 105 of method 100. In some embodiments, the deposition method used to form Ti layer 300 is configured to deposit a thicker Ti layer on horizontal surfaces (e.g., the bottom surfaces of via openings 250/255/275 and the top surface of dielectric layer 260) and a thinner Ti layer on vertical surfaces (e.g., the sidewall surfaces of via openings 250, 255, and 275). For example, thickness 310 of Ti layer 300 on the bottom of via openings 250/255 and 275 is greater than thickness 320 of Ti layer 300 on sidewall surfaces of via openings 250/255 and 275. Therefore, the bottom coverage of Ti layer 300 is greater than the sidewall coverage. Deposition methods that can achieve such nonconformal deposition profile include, but are not limited, to physical vapor deposition (PVD) methods such as ionized metal plasma (IMP) deposition.

In some embodiments, thickness 310 of Ti layer 300 in via openings 250 and 255 ranges between about 5 nm and about 13 nm (e.g., about 10 nm), while thickness 320 ranges between 0 nm and less than about 5 nm (e.g., about 2 nm). Thicker (e.g., greater than about 13 nm) or thinner (e.g., less than about 5 nm) Ti layers are possible; however, thinner Ti layers (e.g., less than about 5 nm) may not form a barrier structure with adequate barrier properties and thicker Ti layers (e.g., greater than about 13 nm) may unnecessarily increase the via resistance. In some embodiments, the process conditions used for the Ti layer deposition can be tailored based on the aspect ratio of via openings 250 and 255 to achieve the desirable bottom and sidewall coverage shown in FIG. 3. By way of example and not limitation, top width W of via openings 250 and 255 can range between about 12 nm and about 20 nm. Further, the aspect ratio of via openings 250 and 255 (e.g., the ratio of height H over top width W) can range between about 6 and about 8. In some embodiments, the deposition of Ti layer 300 is a "blanket deposition." This means that Ti layer 300 is deposited globally, outside via openings 250 and 255; for example, on top surfaces of dielectric layer 260 and in via opening 275 as shown in FIG. 3. In some embodiments, via opening 275 has a lower aspect ratio compared to via openings 250 and 255—for example, between about 1 and about 3.

In the alternative, a Ta layer or a Ni layer can be deposited in place of Ti layer 300. In addition, the Ta or Ni layer can be deposited with a similar bottom and sidewall coverage shown for Ti layer 300 in FIG. 3. For example, the Ta or Ni layer can be deposited using a similar deposition method used for Ti layer 300. For illustration purposes, method 100 shown in FIG. 1 will be described with a Ti layer. However, based on the disclosure herein, other metal layers, such as Ta or Ni, can be used. These metal layers are within the spirit and scope of this disclosure.

In referring to FIG. 1, method 100 continues with operation 110 and the process of treating Ti layer 300 with ammonia ($NH_3$) to form TiN. In some embodiments, the $NH_3$ treatment described in operation 110 is performed in-situ with respect to the deposition of Ti layer 300. In other words, the $NH_3$ treatment of operation 110 is performed without a vacuum-break after the deposition of Ti layer 300. This is to avoid oxidation of the deposited Ti layer as a result of a vacuum-break.

In some embodiments, the $NH_3$ treatment described in operation 110 is a thermal treatment performed at a temperature between about 400° C. and about 450° C. for a duration of about 5 min. Treatment temperatures below about 400° C. require longer treatment times, which increases the overall process time and fabrication cost. On the other hand, higher treatment temperatures above about 450° C. may not be favorable for the stability of the layers included in gate structures 205 and 210.

Figure 4:
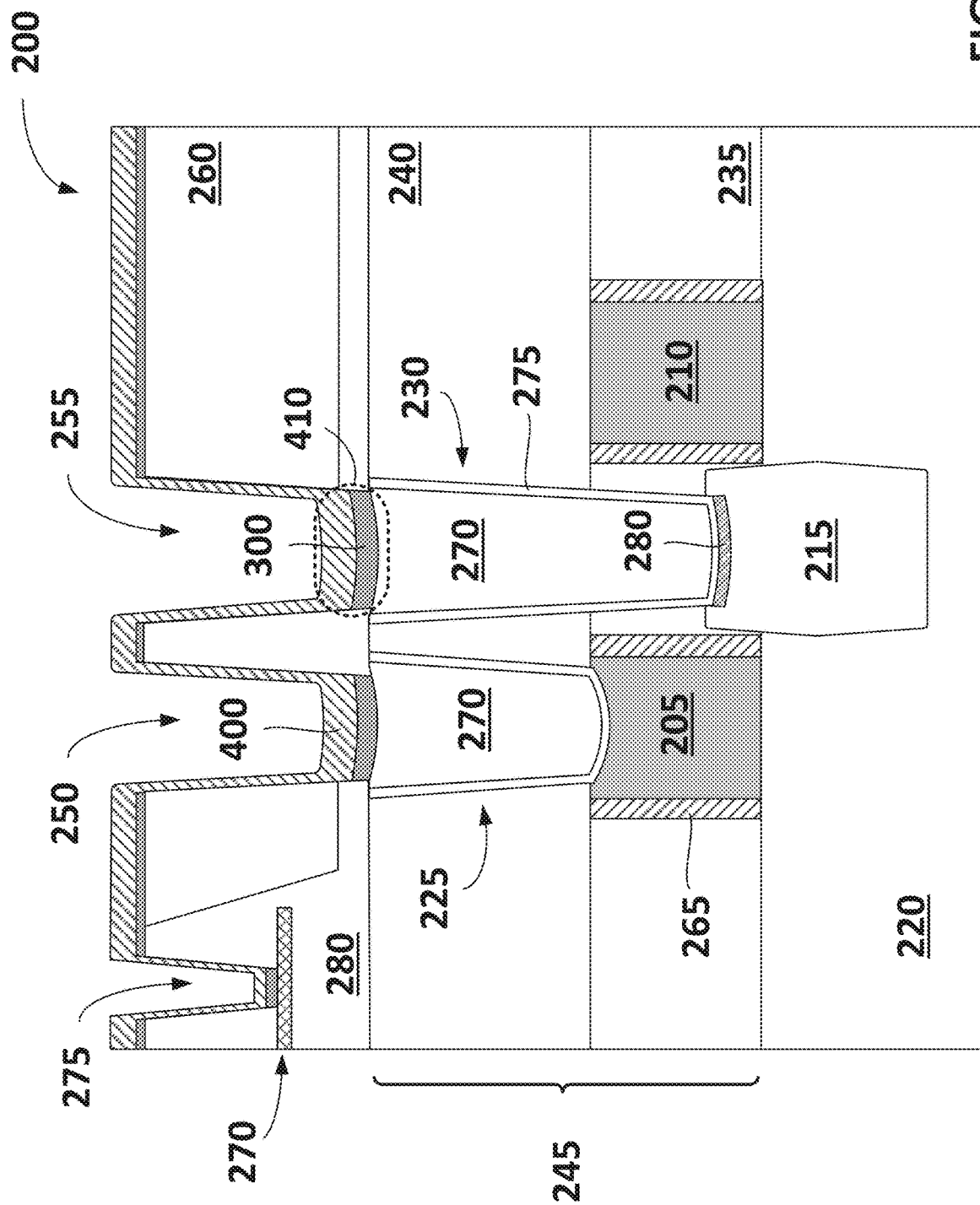

In some embodiments, nitridation of Ti layer 300 (e.g., the formation of the TiN) begins from the exposed top surface of Ti layer 300 and proceeds inwards, towards the bottom surface of Ti layer 300. In other words, during the $NH_3$ treatment described in operation 110, Ti layer 300 is "converted" to TiN from the top surface inwards. Consequently, the treatment of operation 110 can be timed so that thinner portions of Ti layer 300 on sidewall surfaces of via openings 250 and 255 are fully converted to TiN, while thicker portions of Ti layer 300 are partially converted to TiN. Therefore, a TiN layer can be formed on the sidewalls of via openings 250, 255, and 275 where Ti layer 300 is the thinnest, and a Ti/TiN bilayer can be formed on the top surface of dielectric layer 260 and on the bottom surface of via openings 250, 255, and 275 where Ti layer 300 is the thickest. By way of example and not limitation, FIG. 4 shows precursor structures 200 and Ti layer 300 after the formation of a TiN layer 400 on sidewall surfaces of via openings 250, 255, and 275 and of a Ti/TiN bilayer 410 at the bottom of via openings 250/255/275 and at the top surface of dielectric layer 260. In some embodiments, the thickness of TiN layer 400 in Ti/TiN bilayer 410 is about 3 nm and about 9 nm and the thickness of Ti layer 300 is between about 2 nm and 4 nm. In other words, the thickness of Ti/TiN bilayer 410 ranges between about 5 nm and about 13 nm. If the $NH_3$ treatment of operation 110 is extended (e.g., beyond about 5 min), Ti layer 300 at the bottom of vial openings 250, 255, and 275 may be fully converted to TiN layer 400, which is not desirable because TiN is more resistive than Ti and a thicker TiN layer will increase the via resistance. Therefore, the $NH_3$ treatment duration needs to be tailored so that TiN layer 400 has adequate thickness (e.g., barrier performance) without affecting the via resistance. In some embodiments, the duration of the thermal treatment can be tailored based on the sidewall and bottom coverage of Ti layer 300 and the desired thickness of the TiN in Ti/TiN bilayer 410. In other words, a shorter treatment (e.g., shorter than about 5 min) would produce a thinner TiN layer 400 in Ti/TiN bilayer 410 than a longer treatment time (e.g., longer than about 5 min).

If Ta or Ni is used instead of Ti, then operation 110 will form a tantalum nitride (TaN) or a nickel nitride ($Ni_3N$) layer instead of TiN layer 400. Further, aspects of the TaN layer or $Ni_3N$ layer would be similar to TiN layer 400 described above—this includes, for example, the thickness profile of the TaN or $Ni_3N$ layer and the formation of a Ta/TaN or Ni/$Ni_3N$ bilayer at the bottom of via openings 250, 255, and 275.

In Referring to FIG. 1, method 100 continues with operation 115 and the process of exposing TiN layer 400 to an oxygen plasma. In some embodiments, the oxygen plasma oxidizes TiN layer 400 and can proceed to oxidize Ti layer 300 provided that the duration of the oxidation process is sufficiently long.

In some embodiments, the reaction rate between the ions in the oxygen plasma and the TiN layer (e.g., the oxidation rate of the TiN layer) is "mass-transport" limited. In other words, the oxidation rate of the TiN layer increases as the number of available oxygen ions increases and decreases as the number of available oxygen ions decreases. Consequently, if the process conditions of the oxygen plasma process are configured so that the distribution (e.g., density) of the oxygen ions is higher at the top of the via openings and lower at the bottom of the via openings, then a larger number of oxygen ions will be available to oxidize TiN layer 400 on the top of the via openings than at the bottom. This in turn means that the oxidation rate of TiN layer 400 can increase at the top of the via openings and decrease at the bottom of the via openings.

Figure 5:
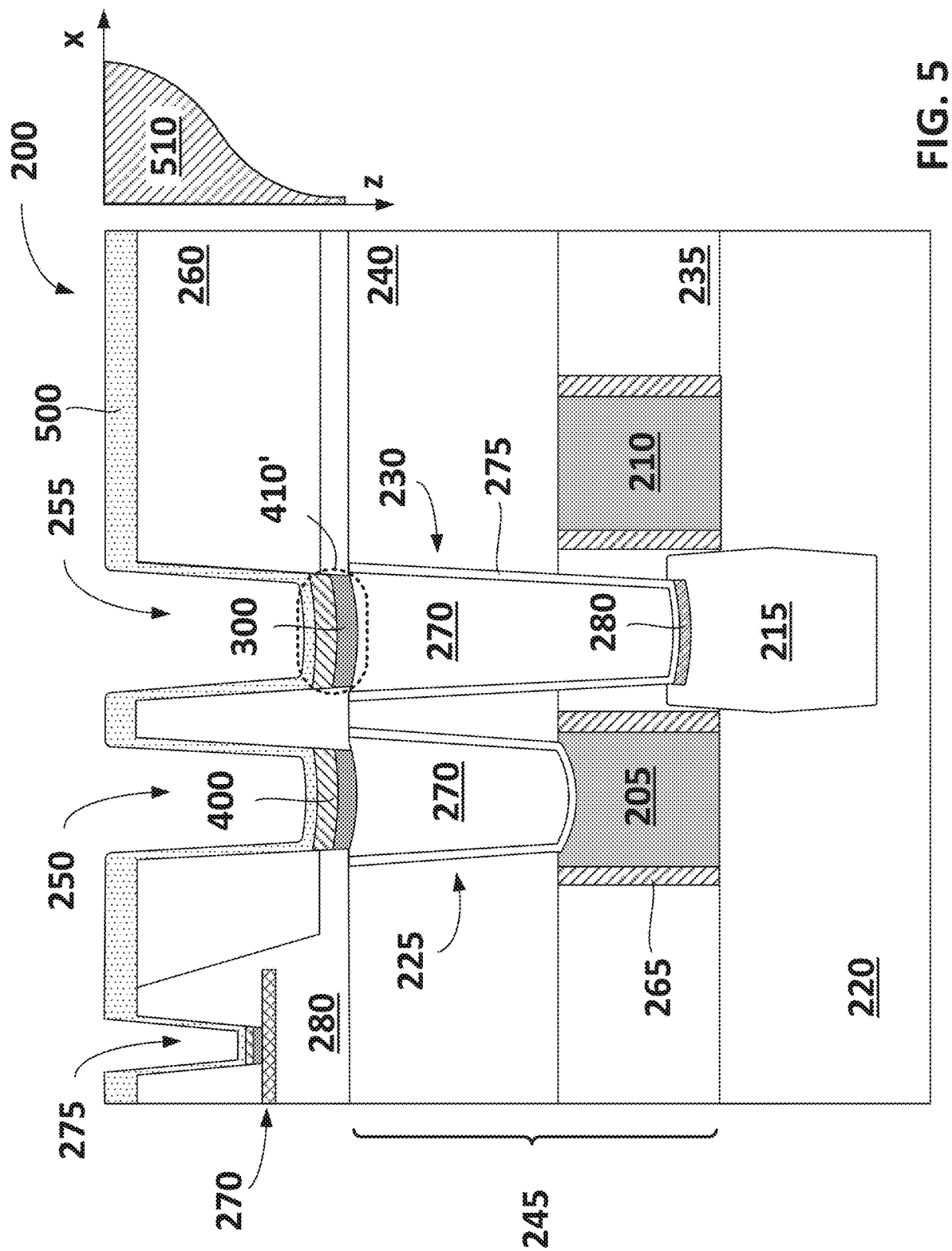

In some embodiments, the oxidation process of operation 115 is configured to form a density gradient of oxygen ions across the thickness of dielectric layer 260. By way of example and not limitation, curve 510 shown in FIG. 5 represents a Gaussian ion density profile in the oxygen plasma as a function of depth during operation 115. In this exemplary representation, the x-axis corresponds to the number of oxygen ions per unit area (e.g., the density of oxygen ions) and the z-axis corresponds to a vertical distance measured from the top surface of TiN layer 400 on dielectric layer 260. As shown by the ion density profile of curve 510, the density of oxygen ions is higher at the top of via openings 250/255/275 and decreases towards the bottom of via openings 250, 255, and 275. In some embodiments, the ion density profile shown in FIG. 5 and represented by curve 510 is not limited to this representation and alternative ion density profiles are possible, such as exponential or linear profiles. These alternative ion density profiles are within the spirit and the scope of this disclosure. By way of example and not limitation, the formation of a density gradient of oxygen ions across the thickness of dielectric layer 260 can be achieved by removing any bias applied to substrate 220 during operation 115.

Consequently, TiN layer 400 disposed on sidewall surfaces of the via openings and the top surface of dielectric layer 260 can be fully oxidized, and TiN layer 400 in Ti/TiN bilayer 410 at the bottom surfaces of via openings 250, 255, and 275 can be partial oxidized mainly due to the oxidation rate difference provided by the density gradient of the oxygen ions in the plasma. It is further noted that the thickness of Ti/TiN bilayer 410 is reduced by an amount equal to about the thickness of TiN oxidized by operation 115. In some embodiments, between about 62% and about 68% of TiN layer 400 is oxidized during operation 115. By way of example and not limitation, FIG. 5 shows the resulting $TiO_2$ layer 500 formed on Ti/TiN bilayer 410— which is thinner than Ti/TiN bilayer 410 shown in FIG. 4 as discussed above. In some embodiments, the thickness of $TiO_2$ layer 500 on Ti/TiN bilayer 410' is between about 2 nm and 6 nm, the thickness of TiN layer 400 is between about 1 nm and 3 nm, and the thickness of Ti layer 300 is between about 2 and 4 nm.

In some embodiments, operation 115 is performed at a temperature between about 160° C. and 250° C. In some embodiments, temperatures below about 160° C. may slow down or even cease the oxidation reaction. On the other hand, temperatures above 250° C. may increase the oxidation rate beyond control or jeopardize the stability of the layers included in gate structures 205 and 210. In some embodiments, if an oxygen plasma process is not desirable due to plasma damage concerns, the oxygen plasma process of operation 115 can be replaced with a thermal process. For example, TiN layer 400 can be exposed to an annealing process in oxygen at a temperature range between about 350° C. and about 550° C. In some embodiments, the temperature range for the annealing process can be elevated compared to the temperature range used in the oxygen plasma process.

In cases where Ta or Ni is used, operation 115 will form a tantalum oxide $TaO_5$ or a nickel oxide (NiO) layer, respectively, instead of $TiO_2$ layer 500. Further, aspects of the $TaO_5$ or NiO layer would be similar to $TiO_2$ layer 500 described above—this includes, for example, the thickness profile of the $TaO_5$ or NiO layer inside and outside via openings 250 and 255.

In Referring to FIG. 1, method 100 continues with operation 120 and the process of removing the $TiO_2$ layer formed during operation 115 with a chlorine-based etching chemistry. In some embodiments, the chlorine-based etching chemistry includes a metal such as tungsten (e.g., $WCl_5$), tantalum ($TaCl_5$), molybdenum ($MoCl_5$), or niobium ($NbCl_5$). In some embodiments the etching chemistry is selective towards the metal oxide layer to be removed—for example, $TiO_2$, $Ta_2O_5$, or NiO. For example, the selectivity between the metal oxide and other layers (e.g., dielectric layer 260 and Ti layer 300) can be about 100:1 or greater. In some embodiments, the etching process is self-limiting when the underlying layer to the metal oxide is a metal nitride (e.g., $TiO_2$ and TiN; $Ta_2O_5$ and TaN; or NiO and $Ni_3N$) or a dielectric layer such as dielectric layer 260. According to some embodiments, the etching process is performed at a temperature range between about 400° C. and about 550° C. (e.g., between about 400° C. and 500° C.) to ensure that sufficient thermal energy is available for the etching reaction to occur and gaseous byproducts are produced so that they can be removed from the etched surfaces. In some embodiments, temperatures above about 550° C. may not be desirable because, as discussed above, they can impact the stability of the layers in gate structures 205 and 210.

Figure 6:
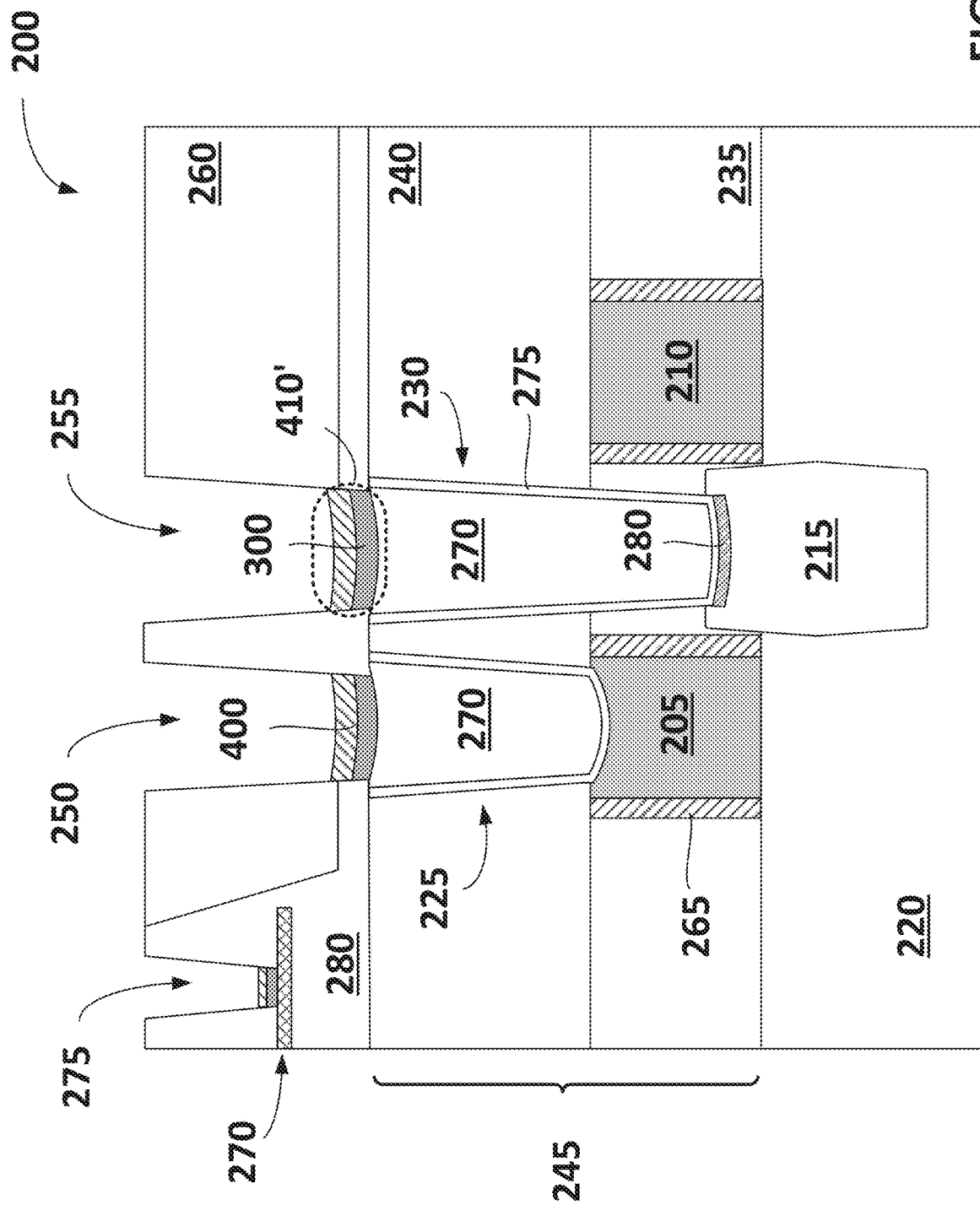

According to some embodiments, FIG. 6 shows precursor structure 200 after the etching process described in operation 120. In FIG. 6, TiN layer 400 is limited to the bottom of via openings 250, 255, and 275 within TiN bilayer 410'. Further, as discussed above, TiN layer 400 in Ti/TiN bilayer 410' is thinner than TiN layer 400 in Ti/TiN bilayer 410 shown in FIG. 4. In some embodiments, the thickness of Ti/TiN bilayer 410' is about half the thickness 310 of the as-deposited Ti layer 300 shown in FIG. 3—e.g., between about 3 nm and about 7 nm. According to some embodiments, Ti layer 300 and TiN layer 400 in Ti/TiN bilayer 410' form a barrier structure that protects underlying metal 270 in gate contact 225 and S/D contact 230.

In some embodiments, Ti/TiN bilayer 410' formed in via opening 275 may not be as critical as in via openings 250 and 255 if resistor structure 270 includes, for example, TiN or a material that is not susceptible to erosion. However, in embodiments where resistor structure 270 includes a material or layer that is susceptible to erosion, Ti/TiN bilayer 410' can be used to protect resistor structure 270.

In referring to FIG. 1, method 100 continues with operation 125 and the process of depositing an amorphous silicon ("a-Si" or "Si") on Ti/TiN bilayer 410' to form a silicon-containing layer, which is used as a nucleation layer (e.g., seed layer) for the bottom-up deposition of the metal in via openings 250, 255, and 275. In some embodiments, the formed silicon-containing layer can also include titanium and nitrogen originating from the underlying Ti/TiN bilayer 410'. According to some embodiments, Si is deposited with a CVD process that includes a pre-treatment with titanium chloride ($TiCl_4$) at a temperature between about 400° C. and about 550° C., followed by an in-situ silane ($SiH_4$) soak at a substantially similar temperature range (e.g., between about 400° C. and about 550° C.). Other suitable deposition methods for the silicon-containing layer may also be used. As discussed above, temperatures above 550° C. should be avoided to protect the layers in gate structures 205 and 210. Further, temperatures below 400° C. may not be sufficient to decompose the $SiH_4$ precursor or to form the silicon-containing layer.

In some embodiments, an amorphous germanium ("a-Ge" or "Ge") layer can be deposited in place of Si with a similar deposition method. For example, the Ge layer deposition can include a pre-treatment with titanium chloride ($TiCl_4$) at a temperature between about 400° C. and about 550° C., followed by an in-situ deposition of Ge using germane ($GeH_4$) precursor at a substantially similar temperature range (e.g., between about 400° C. and about 550° C.). By way of example and not limitation, Ge can be deposited by CVD or any other suitable deposition method. As discussed above, temperatures above 550° C. should be avoided to protect the layers in gate structures 205 and 210. Further, temperatures below 400° C. may not be sufficient to decompose the GeH$_4$ precursor or to form the germanium-containing layer. In some embodiments, like in the silicon-containing layer, the formed germanium-containing layer includes titanium and nitrogen originating from the underlying Ti/TiN bilayer 410'.

Figure 7:
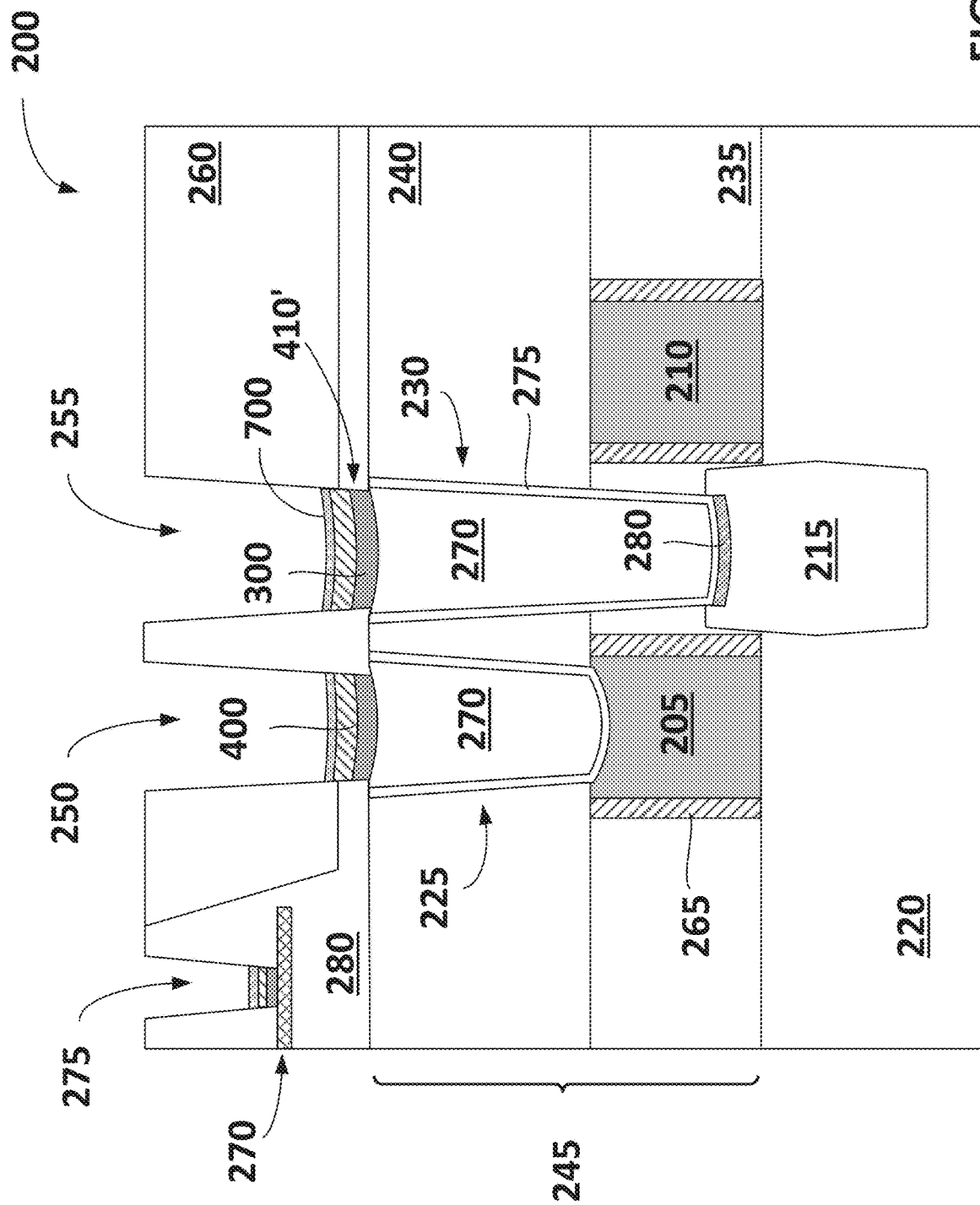

In referring to FIG. 7, during the aforementioned Si deposition process (or Ge deposition process), a silicon-containing layer (or a germanium-containing layer) 700 is formed on Ti/TiN bilayer 410'. In some embodiments, silicon-containing barrier layer (or germanium-containing layer) 700 has a thickness between about 1 Å and about 10 Å. According to some embodiments, the aforementioned deposition temperature (e.g., between about 400° C. and about 550° C.) is sufficient to initiate diffusion of silicon atoms in the underlying TiN to form silicon-containing layer (or germanium-containing layer) 700—for example, TiSiN (or TiGeN). In some embodiments, the resulting silicon-containing layer (or germanium-containing layer) further includes silicon-hydrogen (or germanium-hydrogen) bonds. By way of example and not limitation, formation of a silicon-containing (or germanium-containing) layer 700 with a thickness greater than about 10 Å may unnecessarily increase the via resistance without providing any additional benefits, while a thickness less than about 1 Å may not facilitate the bottom-up growth of the metal in via openings 250, 255, and 275. In some embodiments, the thickness of silicon-containing (or germanium-containing) layer 700 can be controlled through process conditions, such as the deposition time.

In some embodiments, silicon-containing (or germanium-containing) layer 700 is selectively formed on exposed surfaces of TiN layer 400 and not on dielectric layer 260. This is because TiN surfaces, contrary to dielectric surfaces, are able provide electrons to break the silicon-hydrogen or germanium-hydrogen and allow silicon or germanium to bond to the TiN surfaces.

As discussed above, other metals can be used instead of Ti—for example, Ta or Ni. If Ta or Ni is used, then silicon-containing (or germanium-containing) layer 700 can include Ta, Si (or Ge), and nitrogen or Ni, Si (or Ge), and nitrogen. In some embodiments, and depending on the thickness of Ti layer 300, silicon-containing (or germanium-containing) layer 700 can also include Co. For example, if Ti layer 300 is thin (e.g., about 5 nm), silicon-containing (or germanium-containing) layer 700 can include Ti, Co, nitrogen, and Si (or Ge). If Ta or Ni is used, silicon-containing (or germanium-containing) layer 700 can include Ta, Co, nitrogen, and Si (or Ge) or Ni, Co, nitrogen, and Si (or Ge).

Figure 8:
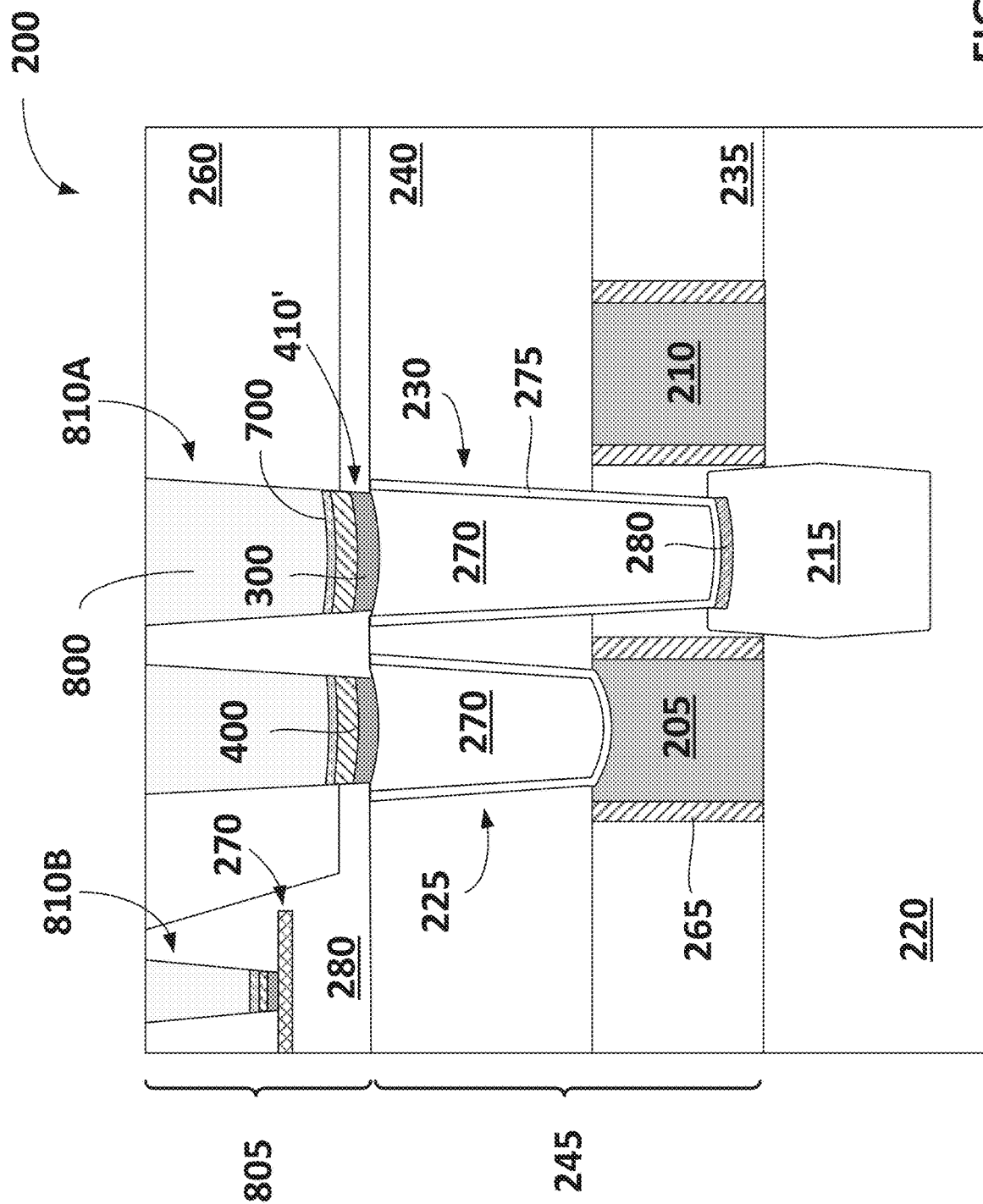

In referring to FIG. 1, method 100 continues with operation 130 and the process of growing a liner-free metal directly on silicon-containing (or germanium-containing) layer 700 to fill via openings 250, 255, and 275. As discussed above, silicon-containing (or germanium-containing) layer 700 acts as a nucleation layer for the subsequent metal deposition in via openings 250, 255, and 275. For example, the silicon-hydrogen (or germanium-hydrogen) bonds in silicon-containing (or germanium-containing) layer 700 can facilitate the bottom-up growth of the via metal. For example in the case of Mo, Mo can be deposited with CVD at a temperature range between about 175° C. and about 275° C. and at a pressure between about 1 Torr and about 3 Torr using molybdenum hexafluoride (MoF$_6$) and hydrogen. In some embodiments, the thickness of the as-deposited metal ranges between about 50 nm and about 150 nm. According to some embodiments, FIG. 8 shows precursor structure 200 after the bottom-up deposition of via metal 800 (e.g., Mo,) and a subsequent CMP process during which via metal 800 extending outside the vias has been polished so that top surfaces of via metal 800 and top surfaces of dielectric layer 260 are substantially coplanar. In some embodiments, the temperature and pressure combination facilitates the bottom-up growth of the Mo metal. For example, at higher temperatures (e.g., higher than about 275° C.) and/or higher pressures (e.g., higher than about 3 Torr), the Mo metal may not grow selectively on silicon-containing (or germanium-containing) layer 700 and start growing on on dielectric layer 260. Under these conditions, bottom-up metal growth may not be possible and voids can be formed in liner-free vias 810A and 810B.

In some embodiments, if a metal other than Mo is used (e.g., Ru, Ir, W, or Co) a silicon-containing or a Ge-containing layer may not be required and the metal may be deposited directly on TiN layer 400 of Ti/TiN bilayer 410'.

In some embodiments, via metal 800 is thermally treated to increase its grain size and improve its conductivity. For example, Mo via metal can be thermally treated in hydrogen to increase its grain size over about 75%. In some embodiments, either during processing or during the aforementioned "grain-growth" thermal treatment, a silicide (or germanide) is formed between the via metal and the silicon-containing (or the germanium in germanium-containing) layer 700. In other words, silicon (or germanium) atoms diffuse into via metal 800 or metal atoms from via metal 800 diffuse into silicon-containing (or germanium-containing) layer 700 to form a silicide (or germanide) with a thickness between about 0.2 nm and 3 nm. In some embodiments, formed silicides (or germanides) include MoSi or MoGe (if Ge is used). In some embodiments, additional silicides or germanides can be formed including but not limited to TiCoSi (or TiCoGe), TaCoSi (or TaCoGe), NiCoSi (or NiCoGe), or a two-element silicide (or germanide) CoSi (or CoGe). In some embodiments, these silicides or germanides may include nitrogen.

In some embodiments, via metal 800 in dielectric layer 260 forms a metallization layer 805 with liner-free vias 810A and 810B disposed on contact layer 245. In some embodiments, additional metallization layers can be formed on metallization layer 805. For example, in referring to FIG. 9, metallization layer 900 can be formed on metallization layer 805. Metallization layer 900 can include dual-damascene conductive structures 905A and/or single-damascene conductive structures 905B embedded in dielectric layer 910. By way of example and not limitation, dual-damascene conductive structures 905A and/or single-damascene conductive structures 905B can include a metal 915 different from via metal 800. For example, metal 915 can be copper (Cu), a copper alloy (e.g., copper-ruthenium (Cu—Ru), copper-aluminum (Cu—Al), copper-manganese (CuMn), etc.), or any other suitable metal or alloy. In some embodiments, a barrier layer or barrier stack 920 surrounds sidewall and bottom surfaces of metal 915 in metallization layer 900. By way of example and not limitation, barrier layer or barrier stack 920 can include Ta and TaN or other suitable layers.

Figure 9:
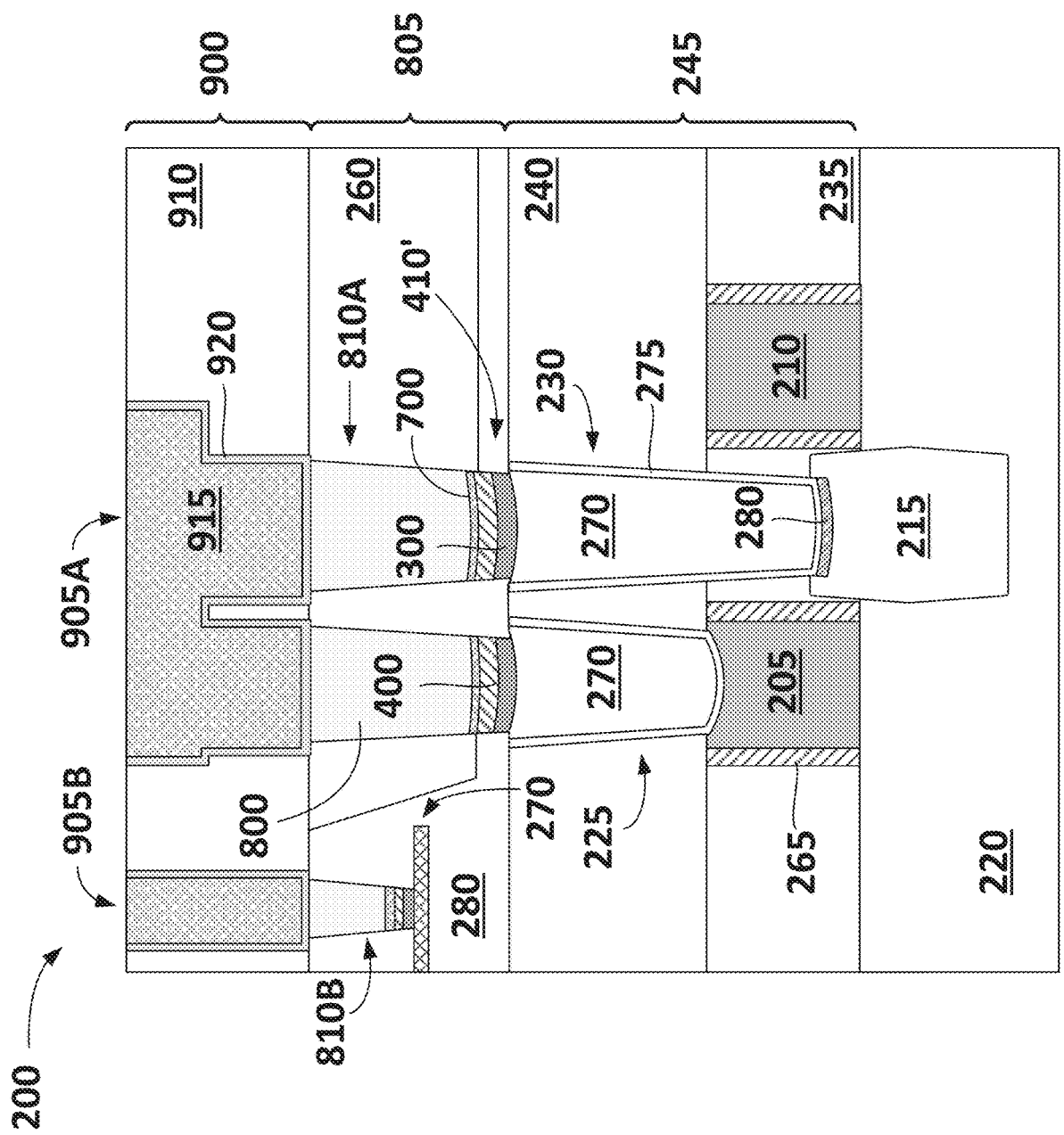
FIGS. 9-10 are a cross-sectional views of barrier structures formed between liner-free vias and a contact layer, in accordance with some embodiments.

In some embodiments, additional layers or features, not shown in FIG. 9 have been omitted for ease of description. Such layers or features include etch stop layers between dielectric layer 240, 260, and 910; etch stop layers on gate structures 205 and 210; additional gate structures; additional S/D epitaxial stacks, additional contacts, doped regions in semiconductor substrate 220, etc. These layers and features are within the spirit and the scope of this disclosure. Further, the layout of contact layer 245 and metallization layers 805 and 900 are not limiting in FIG. 9 and different layouts are possible with additional conductive structures and/or sublayers.

Figure 10:
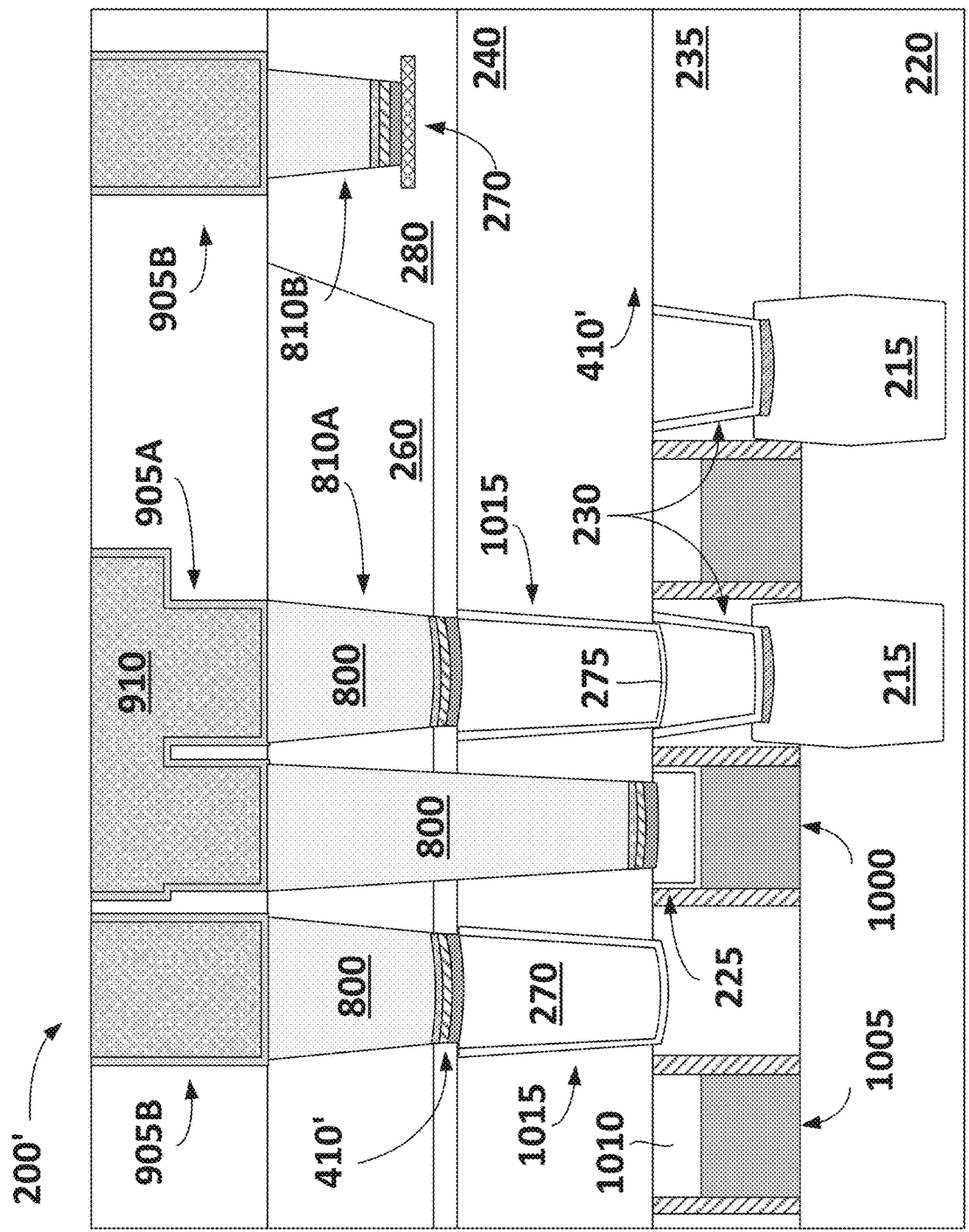

For example, FIG. 10 shows a structure 200' which features a different metallization layout than the precursor structure 200 shown in FIG. 9. As shown in FIG. 10, structure 200' includes gate structures 1000 with gate contacts 225 thereon and gate structures 1005 with a hard mask (HM) layer 1010 thereon. In some embodiments, the gate contacts of gate structures 1005 are formed in a location on gate structures 1005 not visible from the cross-sectional view of FIG. 10. FIG. 10 also includes intervening contacts 1015 (e.g., compared to FIG. 9) formed on S/D contacts 230. By way of example and not limitation, intervening contacts 1015, similarly to gate contacts 225 and S/D contacts 230 shown in FIG. 9, are filled with metal 270 and liner layer 275. This means that S/D contact 230 of FIG. 9 has been replaced in FIG. 10 by two contacts—a shorter S/D contact 230 and intervening contact 1015. In some embodiments, additional intervening contacts 1015 can be connected to S/D contacts 230 not shown in FIG. 10 and one or more S/D contacts 230 can be connected to intervening contacts 1015 not shown in FIG. 10.

Further, FIG. 10 includes liner-free vias 810A with different heights. For example, taller liner-free vias 810A formed on gate contacts 225 and shorter liner-free vias 810A formed on intervening contacts 1015. In some embodiments, liner-free vias 810A connect gate contacts 225 and intervening contacts 1015 to dual-damascene conductive structures 905A and/or single-damascene conductive structures 905B of upper metallization layers as shown in FIG. 10. In some embodiments, liner-free via 810A can be connected to a single-damascene conductive structure 905B, as shown in FIG. 10, or in a dual-damascene conductive structure 905A.

Method 100 can be applied to structures with different metallization schemes to form barrier structures with a silicide (or a germanide) and Ti/TiN bilayers or a silicide (or a germanide) and Ta/TaN bilayers, or a silicide (or a germanide) and Ni/NiN bilayers in liner-free conductive structures. In some embodiments, the aforementioned barrier structures can protect underlying conductive structures or layers from erosion caused by subsequent processes, such as chemical cleans or CMP processes. Consequently, the application of method 100 is not limited to the embodiments described herein and can be implemented with any metallization scheme featuring liner-free conductive structures.

Various embodiments in accordance with this disclosure describe a method for forming a barrier structure between liner-free conductive structures (e.g., liner-free metal vias) and underlying conductive structures (e.g., metal contacts) to prevent slurry or other chemicals from processes used in the liner-free conductive structures to reach and erode a metal fill of underlying conductive structures. In some embodiments, the barrier structure can include bilayers of Ti/TiN, Ta/TaN, or Ni/NiN. In some embodiments, the barrier structure further includes silicon or germanium, which acts as a nucleation site for the bottom-up growth of the metal fill in the liner-free conductive structures. In some embodiments, the underlying metal includes Co and the liner-free metal includes Mo, W, or Ru. In some embodiments, the formation of the barrier structure includes, but is not limited to, the deposition, nitridation, and oxidation of a Ti layer, a Ta layer, or a Ni layer on the sidewall and bottom surfaces of via or contact openings.

In some embodiments, a method includes receiving a substrate with a contact layer formed thereon, where the contact layer comprises conductive structures; forming via openings in a dielectric layer disposed on the contact layer, where the via openings expose top surfaces of the conductive structures. The method also includes depositing a first metal layer in the via openings with the first metal layer deposited thicker on top surfaces of the conductive structures than on sidewall surfaces of the via openings; exposing the first metal layer to ammonia to form a bilayer on the top surfaces of the conductive structures, where the bilayer includes the first metal layer and a nitride of the first metal layer. The method further includes exposing the nitride of the first metal layer to an oxygen plasma to convert a portion of the nitride of the first metal layer to an oxide layer of the first metal layer; removing the oxide layer of the first metal layer; and forming a semiconductor-containing layer on the nitride of the first metal layer in the bilayer.

In some embodiments, a structure includes a substrate, a first dielectric layer on the substrate, a first conductive structure formed in the first dielectric layer, and an etch stop layer formed on the first dielectric layer. The structure further includes a second dielectric layer formed on a first portion of the etch stop layer and coplanar with a second portion of the etch stop layer, where the second portion of the etch stop layer is thicker than the first portion of the etch stop layer. The structure also includes a second conductive structure disposed on the first conductive structure and formed in the second dielectric layer and a barrier structure comprising a metal layer, a nitride of the metal layer, and a silicon- or germanium-containing layer, where the barrier structure is interposed between a top surface of the first conductive structure and a bottom surface of the second conductive structure.

In some embodiments, a structure includes a semiconductor substrate with a source/drain (S/D) structure and a gate structure thereon. The structure further includes first conductive structures on the S/D and gate structures, second conductive structures on the first conductive structures, and a resistor structure adjacent to the second conductive structures with a resistor contact thereon. In addition, the structure includes a barrier structure interposed between the first and second conductive structures and between the resistor structure and the resistor contact, where the barrier structure comprises a metal layer, a metal nitride layer, and a semiconductor-containing layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:
1. A method, comprising:
forming a contact layer on a substrate, wherein the contact layer comprises conductive structures;

forming via openings in a dielectric layer on the contact layer, wherein the via openings expose top surfaces of the conductive structures;

depositing a first metal layer in the via openings, wherein the first metal layer is deposited thicker on a top surface of the conductive structures than on sidewall surfaces of the via openings;

exposing the first metal layer to ammonia to form a bilayer on the top surfaces of the conductive structures, wherein the bilayer comprises the first metal layer and a nitride of the first metal layer;

exposing the nitride of the first metal layer to an oxygen plasma to convert a portion of the nitride of the first metal layer to an oxide layer of the first metal layer;

removing the oxide layer of the first metal layer; and forming a semiconductor-containing layer on the nitride of the first metal layer in the bilayer.

2. The method of claim 1, further comprising:

selectively growing a second metal layer on the semiconductor-containing layer to fill the via openings; and annealing the second metal layer to convert the semiconductor-containing layer to a silicide layer or a germanide layer.

3. The method of claim 2, wherein selectively growing the second metal layer comprises growing molybdenum.

4. The method of claim 1, wherein depositing the first metal layer comprises depositing titanium, nickel, or tantalum.

5. The method of claim 1, wherein exposing the first metal layer to the ammonia comprises converting the first metal layer on the sidewall surfaces of the via openings to the nitride of the first metal layer.

6. The method of claim 1, wherein exposing the nitride of the first metal layer to the oxygen plasma comprises oxidizing the nitride of the first metal layer on the sidewall surfaces of the via openings to convert the nitride of the first metal layer to the oxide layer of the first metal layer.

7. The method of claim 1, wherein removing the oxide layer of the first metal layer comprises removing the oxide layer of the first metal layer with a chlorine-based chemistry.

8. The method of claim 1, wherein removing the oxide layer of the first metal layer comprises removing the oxide layer of the first metal layer from the sidewall surfaces of the via openings.

9. The method of claim 1, wherein forming the semiconductor-containing layer comprises depositing an amorphous silicon layer or an amorphous germanium layer.

10. The method of claim 1, wherein depositing the first metal layer comprises depositing the first metal layer on conductive structures comprising one or more of gate contacts, source/drain contacts, and a resistor structure.

11. A method, comprising:

forming a first dielectric layer on a substrate;

forming a conductive structure in the first dielectric layer;

forming an etch stop layer with first and second portions on the first dielectric layer, wherein the second portion is thicker than the first portion;

forming a second dielectric layer on a first portion of the etch stop layer and coplanar with a second portion of the etch stop layer;

forming a via opening within the second dielectric layer and on the conductive structure;

forming a bilayer of a conductive layer and a nitride layer within the via opening; and forming a semiconductor-containing layer on the bilayer.

12. The method of claim 11, wherein forming the bilayer comprises depositing a metal layer with a thicker bottom portion on a top surface of the conductive structure than a sidewall portion along a sidewall of the via opening; and wherein the bottom portion is thicker than the sidewall portion.

13. The method of claim 12, wherein forming the bilayer comprises performing a nitridation process and an oxidation process on the metal layer.

14. The method of claim 11, further comprising selectively growing a metal layer on the semiconductor-containing layer to fill the via opening.

15. The method of claim 11, wherein forming the semiconductor-containing layer comprises depositing an amorphous silicon layer or an amorphous germanium layer.

16. The method of claim 11, wherein forming the semiconductor-containing layer comprises exposing the nitride layer to titanium chloride ($TiCl_4$) and a semiconductor-containing precursor.

17. A method, comprising:

forming a fin structure on a substrate;

forming a gate structure on the fin structure;

forming a contact structure in a first dielectric layer and on the gate structure;

forming a via opening in a second dielectric layer on the contact structure;

depositing a first metal layer in the via opening;

performing a nitridation process on the first metal layer;

performing an oxidation process on the first metal layer after the nitridation process; and forming an amorphous semiconductor layer on the first metal layer.

18. The method of claim 17, further comprising converting the amorphous semiconductor layer to a silicide layer or a germanide layer.

19. The method of claim 17, further comprising selectively growing a second metal layer on the amorphous semiconductor layer at a temperature between about 175° C. and about 275° C.

20. The method of claim 17, further comprising:

depositing a third dielectric layer on the first dielectric layer; and forming a resistor structure in the third dielectric layer.

* * * * *